United States Patent [19]

Makowiecki et al.

[11] Patent Number: 5,286,361
[45] Date of Patent: Feb. 15, 1994

[54] MAGNETICALLY ATTACHED SPUTTER TARGETS

[75] Inventors: Daniel M. Makowiecki; Mark A. McKernan, both of Livermore, Calif.

[73] Assignee: Regents of the University of California, Oakland, Calif.

[21] Appl. No.: 962,657

[22] Filed: Oct. 19, 1992

[51] Int. Cl.$^5$ .......................................... C23C 14/35
[52] U.S. Cl. ............................ 204/298.12; 204/298.19
[58] Field of Search ..................... 204/298.12, 298.19

[56] References Cited

U.S. PATENT DOCUMENTS

| | | | |
|---|---|---|---|
| 1,758,531 | 5/1930 | Pfanhauser | 204/192.1 |
| 4,049,533 | 9/1977 | Golyanov et al. | 204/298.26 |
| 4,183,797 | 1/1980 | Kennedy et al. | 204/192.12 |
| 4,204,936 | 5/1980 | Hartsough | 204/192.12 |
| 4,392,939 | 7/1983 | Crombeen et al. | 204/298.19 |
| 4,417,968 | 11/1983 | McKelvey | 204/192.12 |
| 4,421,628 | 12/1983 | Quaderer | 204/298.12 |
| 4,545,882 | 10/1985 | McKelvey | 204/192.13 |
| 4,668,373 | 5/1987 | Rille et al. | 204/298.12 |
| 4,761,218 | 8/1988 | Boys | 204/298.19 |
| 4,812,217 | 3/1989 | George et al. | 204/192.12 |
| 4,820,397 | 4/1989 | Fielder et al. | 204/298.12 |
| 4,865,708 | 9/1989 | Welty | 204/192.12 |
| 4,915,805 | 4/1990 | Rust | 204/192.12 |
| 5,009,765 | 4/1991 | Qamar et al. | 204/298.12 |
| 5,021,139 | 6/1991 | Hartig et al. | 204/298.09 |
| 5,022,978 | 6/1991 | Hensel et al. | 204/298.19 |
| 5,032,246 | 7/1991 | Blazic et al. | 264/298.12 |
| 5,112,467 | 5/1992 | Zejda | 204/298.12 |
| 5,147,521 | 9/1992 | Belli et al. | 204/298.12 |
| 5,232,572 | 8/1993 | Schuhmacher et al. | 204/298.12 |

FOREIGN PATENT DOCUMENTS

| | | | |
|---|---|---|---|
| 0449770A2 | 8/1992 | European Pat. Off. | 204/298.12 |
| 0512456A1 | 11/1992 | European Pat. Off. | 204/298.12 |
| 59-129779 | 7/1984 | Japan | 204/298.12 |
| 62-1867 | 1/1987 | Japan | 204/298.12 |
| 63-45368 | 2/1988 | Japan | 204/298.12 |
| 2-285068 | 11/1990 | Japan | 204/298.12 |
| 2-285069 | 11/1990 | Japan | 204/298.12 |
| 4-354868 | 12/1992 | Japan | 204/298.12 |
| 2173217A | 10/1986 | United Kingdom | 204/298.12 |

*Primary Examiner*—Aaron Weisstuch
*Attorney, Agent, or Firm*—Henry P. Sartorio; Danny C. Halverson

[57] ABSTRACT

An improved method and assembly for attaching sputtering targets to cathode assemblies of sputtering systems which includes a magnetically permeable material. The magnetically permeable material is imbedded in a target base that is brazed, welded, or soldered to the sputter target, or is mechanically retained in the target material. Target attachment to the cathode is achieved by virtue of the permanent magnets and/or the pole pieces in the cathode assembly that create magnetic flux lines adjacent to the backing plate, which strongly attract the magnetically permeable material in the target assembly.

35 Claims, 3 Drawing Sheets

MAGNETICALLY ATTACHED SPUTTER TARGETS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

This invention relates generally to vacuum sputter coating apparatus, and more particularly to the non-mechanical attachment of a sputter target to the cathode of a planar magnetron sputtering coating source.

2. Description of Related Art

Cathodic sputtering refers to the erosion of the cathode by ion bombardment that occurs when an electrical discharge is passed between electrodes in a low pressure gas. In the sputtering process inert gas ions with a positive charge are accelerated from the glow discharge, that forms between the electrodes, to the negative cathode. Erosion results from the ejection of atoms and clusters of atoms from the cathode surface as a result of momentum transfer from the bombarding ions. Some of the ejected cathode material condenses on surfaces surrounding the cathode. Sputtering becomes a coating process when the ejected material is deliberately condensed on a substrate suitably positioned near the cathode.

Sputtering is a vacuum coating process where an electrically isolated cathode is mounted in a chamber that can be evacuated and partially filled with an inert gas. If the cathode material is an electrical conductor, a direct-current high-voltage power supply is used to apply the high voltage potential. If the cathode is an electrical insulator, the polarity of the electrodes must be reversed at very high frequencies to prevent the formation of a positive charge on the cathode that would stop the ion bombardment process. Since the electrode polarity is reversed at a radio frequency of 13.56 MHz, this process is referred to as RF-sputtering.

Magnetron sputtering is a more efficient form of diode sputtering that uses a magnetic field to trap electrons in a region near the target surface creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

Ion bombardment not only causes atoms of the target material to be ejected, but it also imparts considerable thermal energy to the target. Consequently, any target attachment scheme must provide for good physical contact to the cathode assembly to allow adequate thermal transfer of the target's heat to the cooling media. This is particularly true in the case of magnetron sputtering where very large ion currents are produced causing a very intense and localized heating of the target.

Various means have been used in the past for holding sputter targets in place within the sputter sources. Commercially available sputter targets today are either bonded directly to the cathode assembly or secured using various mechanical means. The method used to attach the sputter target to the cathode assembly will also greatly affect the size and overall design of the magnetron source, the amount of down time when changing targets, and the overall performance of the source.

In some sputter sources, the cathode targets are positioned adjacent to a fixed backing plate and retained in place by various holding devices. U.S. Pat. Nos. 5,021,139, 4,915,805, and 4,421,628 teach the use of screws to tightly clamp the target to the backing plate. U.S. Pat. No. 4,417,968 shows the use of special end brackets to hold novel cylindrical targets. These brackets are held in place by screws.

U.S. Pat. Nos. 4,812,217 and 4,761,218 disclose the use of mechanically fastened clamps to retain the target against the backing plate. Because these designs have clamping assemblies in line with the cathode, the use of sputter shields over the clamping assembly is required to protect the substrate from being contaminated with undesirable material ejected from the clamping assembly. U.S. Pat. No. 4,049,533 teaches the use of an elastic metal clamping element to retain the cathode in a cooling assembly. Because the elastic clamps are not in line with the cathode, the need for contamination shielding is not required.

In the above designs, the sputtering target is independently removable from the fixed backing plate and cooling assembly for changing or replacing the targets.

In other versions, the sputtering target is physically soldered to a backing plate, usually where the backing plate and the target are inserted and removed as a unit. The advantages of this over mechanical target attachment are firmly retaining the target in position and establishing more intimate thermal contact between the target and the backing plate/cooling assembly.

U.S. Pat. Nos. 5,009,765 and 4,183,797 show the use of joined target-backing plate assemblies. The former uses a complementary holding fixture for securing the welded assembly and the latter suggests that the joined assembly is an integral part of the total sputtering apparatus. U.S. Pat. No. 5,022,978 also suggests the use of a joined target-backing plate assembly as shown in FIG. 2.

In all of the joined target-backing plate designs, when the target is replaced, either both the spent target and the corresponding backing plate must be discarded or a long and tedious target removal operation is required. Also, during target removal from the backing plate it is easy to damage the target backing plate. Further, in designs where the joined assembly is an integral part of the complete system, the difficulty in changing or replacing targets becomes overly burdensome.

Other novel attachment schemes have also been disclosed. U.S. Pat. No. 4,392,939 teaches the use of a vacuum connection where the backing plate has a number of channels which about the contact face of the target and allow the target to be secured against the backing plate by vacuum suction via the channels. This concept, although unique, involves costly precision machining of the vacuum interfaces to be mated and the use of additional plumbing and vacuum systems. A possible advantage of a vacuum attachment over mechanical attachments is that it offers a more uniform thermal contact between the target and backing plate, without all the complexities associated with bonded assemblies.

U.S. Pat. No. 4,204,936 discloses the use of a ferromagnetic target retainer which releasably clamps the target to the backing plate by virtue of its attraction to existing magnetic fields in the cathode assembly. The retainer engages a lip in the central aperture of the sputter target allowing it to press the back surface of the target against the cathode assembly. In all the designs, the ferromagnetic retainer is exposed in the center and at the surface of the sputter target. Although the retainer may be located outside the erosion area of the sputter target, it is a very real source of contamination in the sputtering process. All target attachment methods that employ clamping assemblies in line with the cathode use sputter shields to prevent sputtering of the clamping assembly as described in U.S. Pat. Nos. 4,812,217 and 4,761,218. An additional disadvantage of these designs is the central aperture in the sputter target that will not allow the retrofit to existing planar magnetron sputter sources that utilize a solid target.

SUMMARY OF THE INVENTION

It is an object of this invention to provide a method and apparatus for attaching a target to the backing plate cooling assembly of a sputtering system so that it can be quickly, safely, and easily installed and removed.

Another object of this invention is to provide a method and apparatus for magnetically attaching a target to the backing plate cooling assembly of a magnetron sputtering source that is not exposed to the glow discharge and that does not constitute a potential source of foreign atoms in the sputtering process.

Another object of this invention is to provide a target apparatus that offers the design simplicity of a bonded target assembly, with greater convenience and improved thermal contact over a simple mechanically attached target assembly.

Another object of this invention is to provide replacement sputtering targets that will retrofit most cathode designs in a cost effective manner.

Briefly, the invention comprises imbedding a small piece of magnetically permeable material in the center of the cooled surface of the sputter target. This material acts in conjunction with the existing permanent magnetic field of the cathode assembly to firmly hold the target to the backing plate. The imbedded magnetically permeable material is situated such that it is substantially away from the target cathode's sputtering surface, thereby avoiding contamination.

BRIEF DESCRIPTION OF THE DRAWINGS

The various novel features of this invention, along with the foregoing and other objects as well as the invention itself both as to its organization and method of operation, may be more fully understood from the following description of the illustrated embodiments when read in conjunction with the accompanying drawings wherein.

DETAILED DESCRIPTION OF THE INVENTION

Figure 1:
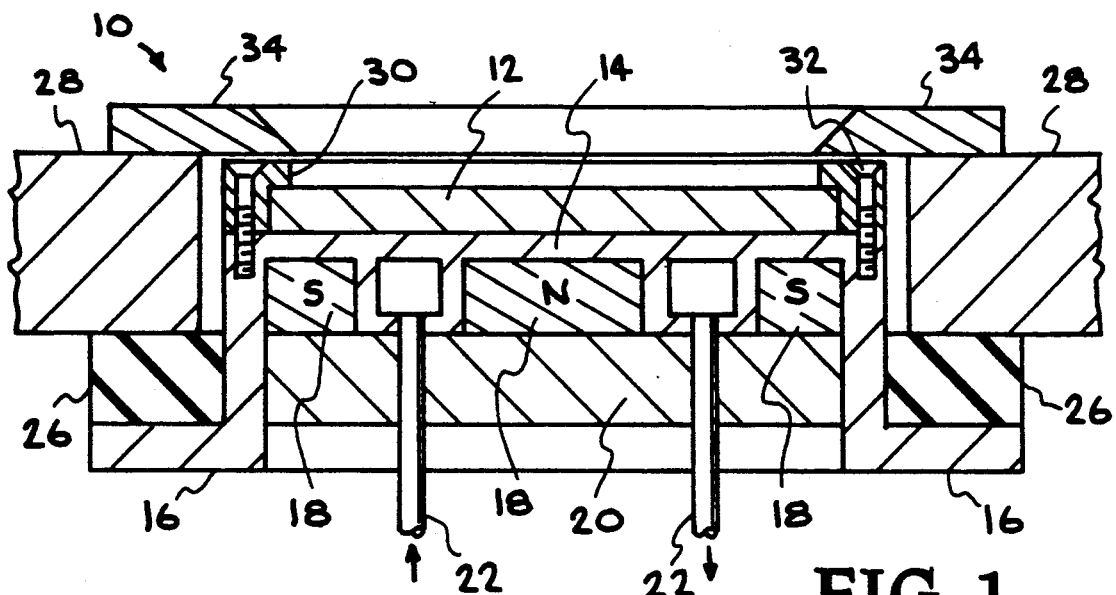
FIG. 1 is a schematic cross-section view of a simple sputtering assembly illustrating a prior art mechanical attachment means.
Figure 2:
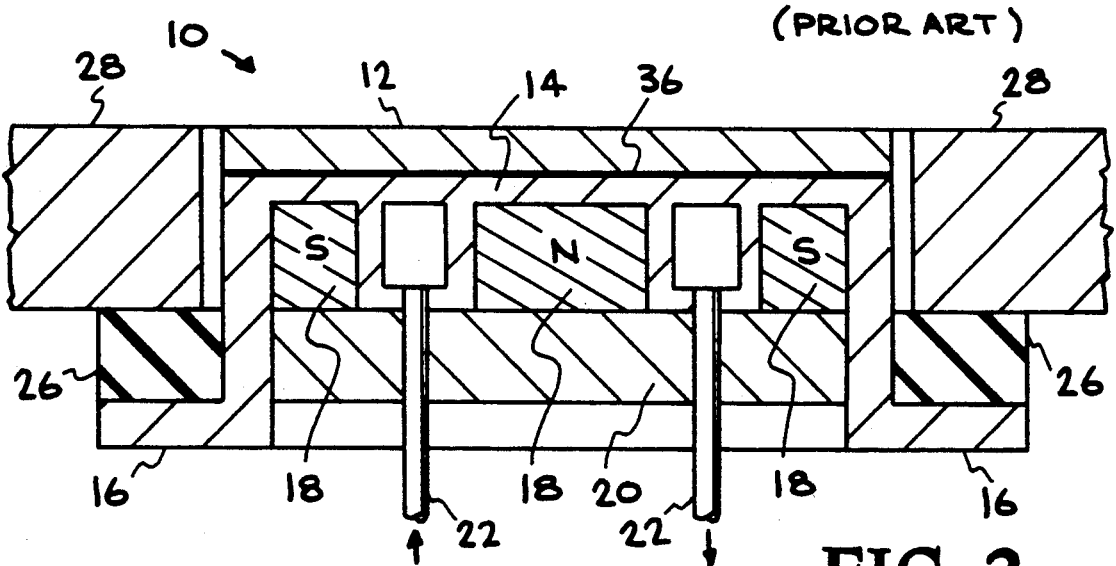
FIG. 2 is a schematic cross-section view of a simple sputtering assembly illustrating a prior art bonded attachment means.
Figure 3:
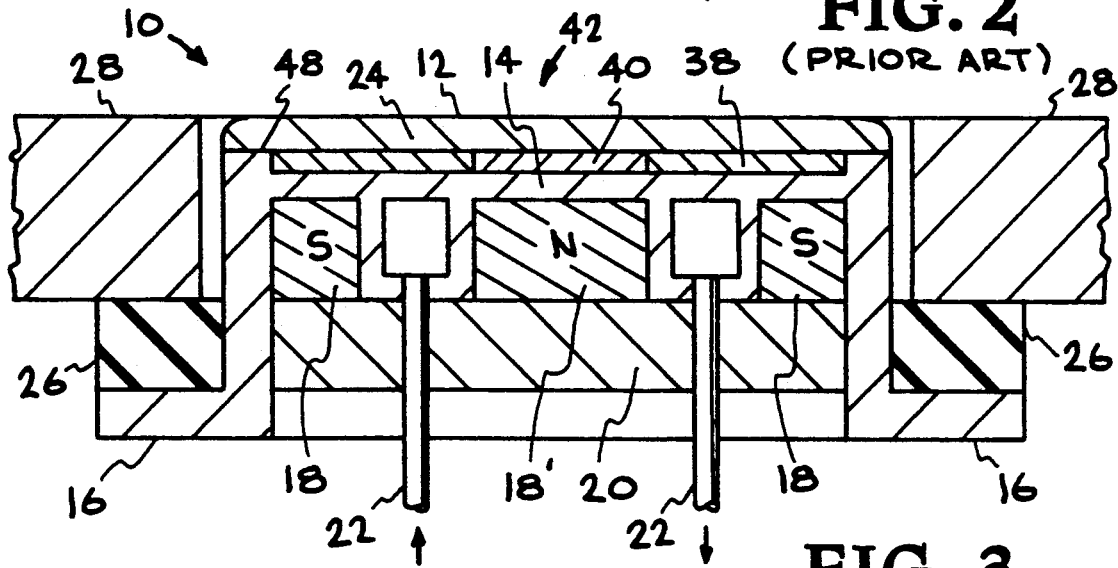
FIG. 3 is a schematic cross-section view of a simple sputtering assembly illustrating a magnetic attachment means in accordance with the present invention.

Referring to FIGS. 1-3, there is shown a sputtering cathode assembly 10 of the planar magnetically-enhanced type, shown to include a target 12 attached to a backing plate 14, which is an integral part of the cathode housing 16 containing a plurality of permanent magnets 18. The backing plate 14 is liquid cooled through inlet and outlet pipes 22. Pole piece 20 causes the flux produced by the permanent magnets to be directed in a manner that enhances the performance of the sputtering cathode assembly 10. A vacuum-tight insulator 26 separates the cathode housing 16 from the wall 28 of the vacuum chamber wherein the substrate to be coated (not shown) resides.

Referring now additionally to FIG. 1, an example of a prior art mechanical attachment means is illustrated where the target 12 is held against the backing plate 14, in compression, by way of an annular retaining bracket 30 which is held down by screws 32 inserted through the retaining bracket 30 and into the cathode housing 16. Mechanical attachment schemes oftentimes require the placement of sputtering shields 34 to protect the substrate (not shown) from being coated with contaminants sputtered from the retaining bracket 30 and the screws 32.

Referring now additionally to FIG. 2, an example of a prior art bonded attachment means is illustrated, where the target 12 is joined by weld or braze 36 to the backing plate 14.

Figure 4:
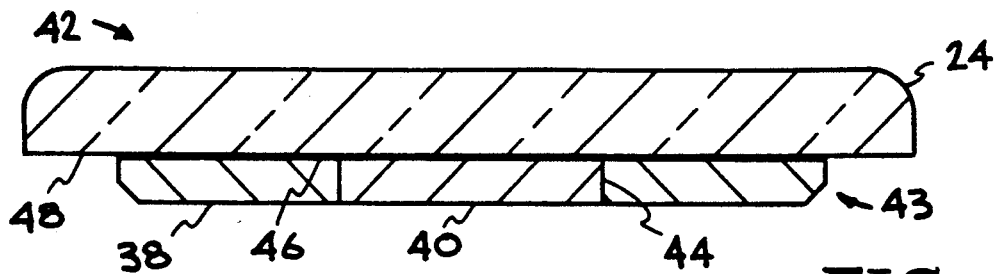
FIG. 4 is an enlarged view of the target cathode and magnetic attachment means in accordance with the present invention.

Referring now to FIG. 4, one novel design of the sputter target cathode and magnetic attachment means, in accordance with the present invention, is shown. This is the preferred design when the target material 24 is hard and difficult to machine (e.g., ceramics, silicon, carbon, boron, glasses, etc.) The target assembly 42 includes the target material 24 and a magnetically permeable body 40. The magnetically permeable body 40 is located in the lower central portion of the target assembly 42. The magnetically permeable body 40, in this design, is bonded to a separate metallic retainer 38 with a braze 44, creating a thin metal target base 43. The target material 24 is then bonded to the thin metal target base 43 with a vacuum braze, solder, or conductive epoxy 46. The preferred materials for the metallic retainer 38 are copper and molybdenum. The preferred materials for the magnetically permeable body 40 are steel permendur, vanadium permendur, carbon steel, and iron.

Referring now additionally to FIG. 3, the novel method of attaching the target 12 to the backing plate 14, in accordance with the present invention, is shown. The complete target assembly 42 of FIG. 4 is held tightly against the backing plate 14 of the sputtering cathode assembly 10 due to the strong attraction of the magnetically permeable body 40 to the plurality of permanent magnets 18. The size of the magnetically permeable body 40 can be as large as the center magnet 18' in the sputtering cathode assembly 10. Its thickness is adjusted to produce the desired holding force on the target assembly 42. Example dimensions of an annular target assembly 42 are 3.0 cm (1.2 in) diameter by 0.50 cm (0.20 in) thick, with the target material 24 being 0.36 cm (0.14 in) thick and the thin metal target base 43 being 0.14 cm (0.06 in) thick. Example dimensions of the magnetically permeable body 40 are 1.0 cm (0.4 in) diameter by 0.14 cm (0.06 in) thick.

Referring now additionally to FIGS. 3 and 4, the use of geometrically complex targets can now be used with the present invention. For example, one or more steps 48 can be incorporated into the target assembly 42 to properly locate the target assembly 42 on the backing plate 14 and cathode housing 16. The steps 48 can also serve as a shielding lip to protect against sputter contamination from the cathode housing 16 or other exposed components in line with the sputtering cathode assembly 10. This could not be accomplished with the prior art attachment schemes of FIGS. 1 and 2, because of design constraints or the existence of complex bondlines.

Figure 5:
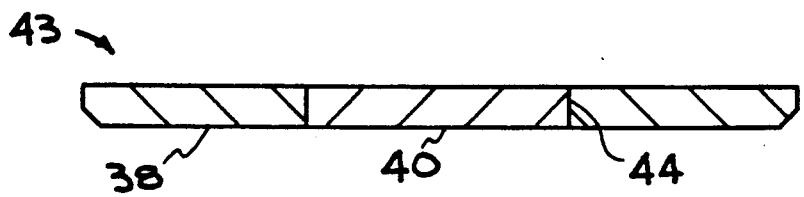
FIG. 5 is an enlarged view of the magnetic attachment means in accordance with the present invention that has been sliced from the assembly shown in FIG. 6.
Figure 6:
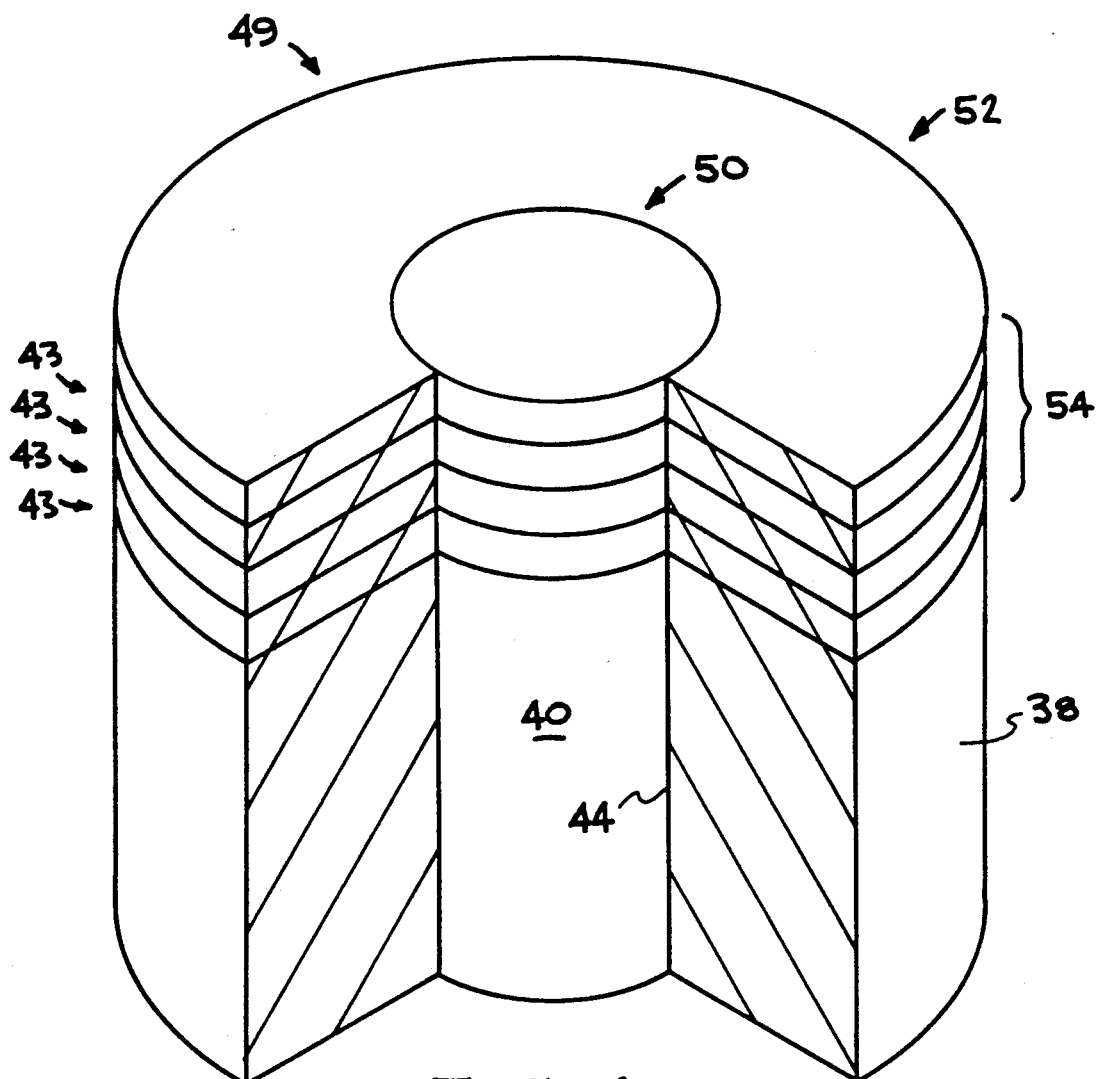
FIG. 6 is a bulk assembly where a rod of magnetically permeable metal is held within the confines of another metal cylinder.

Referring now to FIGS. 5 and 6, the novel fabrication of the thin metal target base 43 is illustrated in accordance with the present invention. Referring now to FIG. 6, the thin metal target bases 43 are fabricated from a bulk assembly 49, consisting of a solid cylindrical rod of magnetically permeable material 50 used for the magnetically permeable body 40, surrounded by a hollow cylinder of thermally conductive material 52 used for the metallic retainer 38. The cylindrical rod of magnetically permeable material 50 is joined to the hollow cylinder of thermally conductive material 52 by a braze 44. The bulk assembly 49 is then cut into the thin metal target bases 43 by slicing the bulk assembly 49 along the desired thickness section lines 54.

Figure 7:
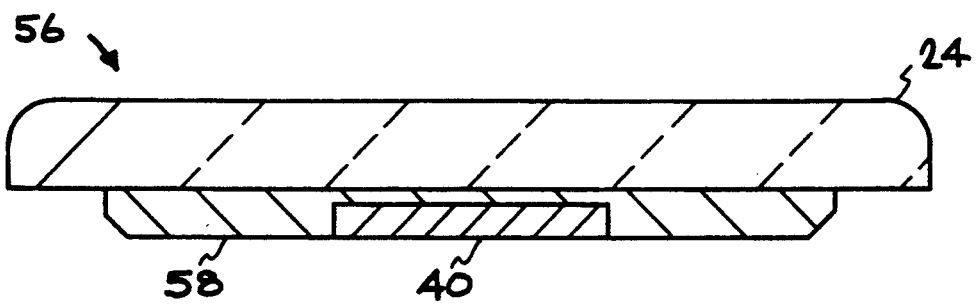
FIG. 7 is an enlarged view of an alternative target cathode and magnetic attachment means in accordance with the present invention.

Referring now to FIG. 7, another novel design of an alternative sputter target cathode and magnetic attachment means, in accordance with the present invention, is shown. This is another preferred design when the target material 24 is hard and difficult to machine, and in particular when the target material 24 is carbon. The target assembly 56 includes the target material 24 and a magnetically permeable body 40. The magnetically permeable body 40 is located in the lower central portion of the target assembly 56. The rear of target material 24 is coated with PVD (Physical Vapor Deposited) aluminum 58 that is soft and easily machined to incorporate the magnetically permeably body 40. This method is particularly useful for carbon targets because the PVD coating process is carried out at temperatures between 600°-800° C. which is the temperature range that aluminum will wet and strongly bond to carbon.

Figure 8:
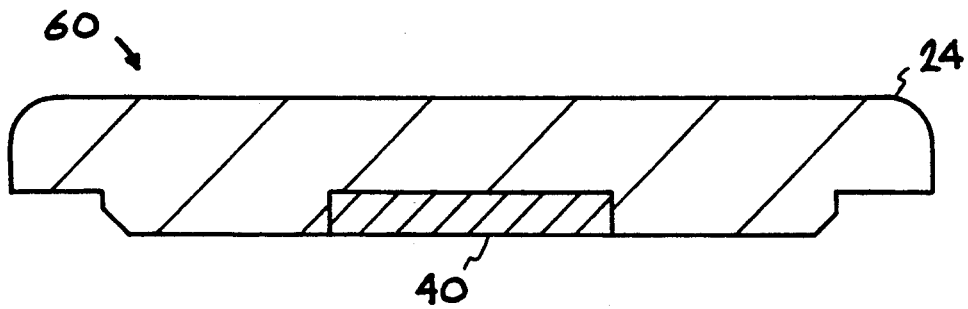
FIG. 8 is an enlarged view of another alternative target cathode and magnetic attachment means in accordance with the present invention.

Referring now to FIG. 8, another novel design of another alternative sputter target cathode and magnetic attachment means, in accordance with the present invention, is shown. This is the preferred design when the target material 24 is soft and easy to machine (e.g., aluminum, copper, gold, silver, etc.). The target assembly 60 consists of the target material 24 and a magnetically permeable body 40 imbedded in target material 24. The magnetically permeable body is located in the lower central portion of the target assembly 60. The target material 24 is soft and easily machined to incorporate the magnetically permeable body 40.

Figure 9:
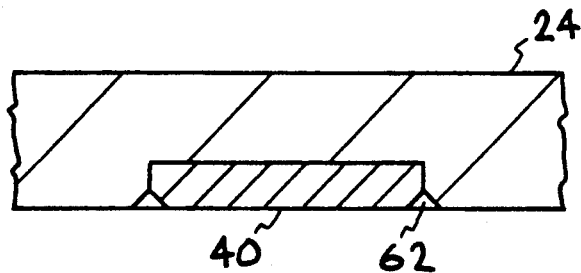
FIG. 9 is a view detailing a method of fastening the magnetically permeable metal to one of the alternative target cathode and magnetic attachment means in accordance with the present invention.
Figure 10:
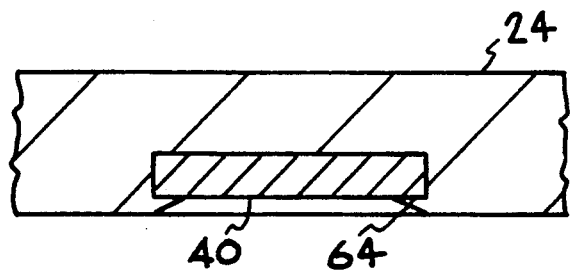
FIG. 10 is a view detailing an alternative method of fastening the magnetically permeable metal to one of the alternative target cathode and magnetic attachment means in accordance with the present invention.
Figure 11:
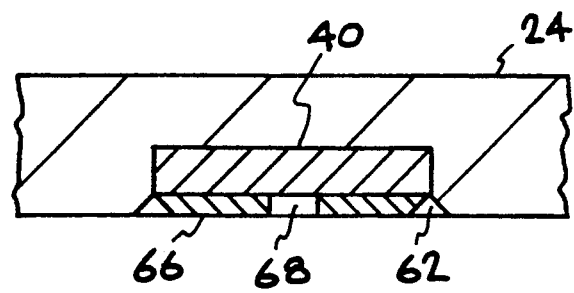
FIG. 11 is a view detailing another alternative method of fastening the magnetically permeable metal to one of the alternative target cathode and magnetic attachment means in accordance with the present invention.

Referring now to FIGS. 9 through 11, three different methods of fastening the magnetically permeable body 40 to the target material 24 in the alternative sputter target cathode and magnetic attachment means design of FIG. 8, in accordance with the present invention, are shown. Referring now to FIG. 9, the magnetically permeable body 40 is fastened to the target material 24 by a laser or spot weld 62. Referring now to FIG. 10, the magnetically permeable body 40 is fastened to the target material 24 by peening or crimping the target material 24 to create a retaining lip 64. Referring now to FIG. 11, the magnetically permeable body 40 is fastened to the target material 24 by holding it in place with a cover plate 66 that is held in place by a laser or spot weld 62. Vacuum relief hole 68 in the cover plate 66 is used to avoid pressure differences in the space containing the magnetically permeable body 40, when it is exposed to vacuum environments. The selected fastening means will depend upon the ductility of the material which retains the magnetically permeable body 40. Although illustrated with respect to the embodiment of FIG. 8, the spot welding, crimping, or use of a cover plate shown in FIGS. 9-11 can be applied to other embodiments (for example, FIG. 7).

The present invention is superior over other magnetically attachable schemes where magnetic retaining brackets, analogous to the annular retaining bracket 30 (FIG. 1) used with mechanical attachments, are used to hold the sputter target in place. Such inferior designs typically require the magnetic retaining brackets to be considerably larger than the target they constrain. This is due to the inefficiency of this design concept for holding large targets. The large size magnetic retaining bracket consequently must be shielded to a greater extent than the smaller brackets used with mechanical attachments. This makes it difficult to retrofit existing sputtering systems because a major portion of target area must be sacrificed for a bulky magnetic retaining bracket.

In the present invention, however, target retention is accomplished by an imbedded magnetically permeable material at the back of the sputter target. This allows the originally designed target area of the system to be maintained. No target depth is sacrificed with a retrofit because the typical erosion profile does not reach the location of magnetically permeable material.

Furthermore, the conformable design of the imbedded magnetically permeable material, allows the attractive forces to be maximized thereby maintaining strong interfacial contact between the target and the backing plate, regardless of the target geometry (annular, cylindrical, rectangular, etc.). This, in conjunction with the design of the highly conductive thin metal target base, offers optimum heat transfer characteristics to most sputtering cathode assemblies.

The present invention clearly combines the design simplicity of a bonded target assembly with greater convenience than a simple mechanically attached target assembly.

While this invention has been described with reference to several preferred embodiments, it is contemplated that various alterations and modifications thereof will become apparent to those skilled in the art upon a reading of the preceding detailed description. It is therefore intended that the following appended claims be interpreted as including all such alterations and modifications as fall within the true spirit and scope of this invention.

We claim:

1. A method for attaching a sputtering target assembly to a backing plate of a sputtering cathode assembly, comprising the steps of:
   providing a sputter target having a sputtering surface and an opposed back surface;
   forming a target assembly by attaching a magnetically permeable body to a base portion of said sputter target;
   positioning a surface of said target assembly containing the magnetically permeable body against a conforming surface of the backing plate of the sputtering cathode assembly to hold the target assembly in place by the attractive forces generated within the sputtering cathode assembly by permanent magnets and/or pole pieces that create magnetic flux lines adjacent to the backing plate.

2. The method of claim 1, wherein the target assembly is formed by the steps of:
   forming a thin metal target base by bonding the magnetically permeable body to a thermally conductive metallic retainer, such that said magnetically permeable body is held within said thermally conductive metallic retainer; bonding said thin metal target base to the sputter target.

3. The method of claim 2 wherein said thin metal target base is fabricated by cutting, slicing, or wafering it from a bulk assembly comprising a solid cylindrical rod of magnetically permeable material centrally brazed to a surrounding hollow cylinder of thermally conductive material.

4. The method of claim 2 wherein said thin metal target base is fabricated by the physical vapor deposition of a machinable thermally conductive metal onto the back surface of said sputter target and imbedding said magnetically permeable body within said thermally conductive metallic retainer.

5. The method of claim 4 wherein said magnetically permeable body is fastened to said physical vapor deposited metal using a method selected from the group consisting of laser welding, spot welding, peening, crimping, and laser or spot welding a cover plate over said magnetically permeable body.

6. The method of claim 5 wherein said cover plate has a vacuum relief hole.

7. The method of claim 4 wherein said physical vapor deposited metal is aluminum.

8. The method of claim 2 wherein said steps of bonding are selected from the group consisting of brazing, welding, and soldering.

9. The method of claim 8 wherein said steps of bonding are performed under vacuum or in an inert gas atmosphere.

10. The method of claim 2 wherein said thermally conductive metallic retainer is selected from the group consisting of copper, aluminum, and molybdenum.

11. The method of claim 1 wherein said magnetically permeable body is imbedded in said base portion of the sputter target.

12. The method of claim 11 wherein said magnetically permeable body is fastened to said sputter target using a method selected from the group consisting of laser welding, spot welding, peening, crimping, and laser or spot welding a cover plate over said magnetically permeable body.

13. The method of claim 12 wherein said cover plate has a vacuum relief hole.

14. The method of claim 1 wherein said magnetically permeable body is selected from the group consisting of steel permendur, vanadium permendur, carbon steel, and iron.

15. The method of claim 1 wherein said sputter target is selected from the group consisting of aluminum, copper, gold, silver, boron, carbon, ceramics, and glasses.

16. The method of claim 1 further comprising configuring said target assembly to conform to said sputtering cathode assembly by incorporating geometrically-compatible steps in said target assembly that mate with similar geometrically-compatible steps in said cathode assembly to assist in properly locating said target assembly on said cathode assembly.

17. The method of claim 1 further comprising configuring said target assembly to geometrically conform to said sputtering cathode assembly to shield the backing plate and other components of the sputtering cathode assembly from contaminating a substrate being coated.

18. A target assembly comprising a sputter target and a magnetically permeable body attached to a base portion of the sputter target.

19. The target assembly of claim 18 wherein said base portion of the sputter target is bonded to a thin metal target base consisting of said magnetically permeable body bonded to a thermally conductive metallic retainer, such that said magnetically permeable body is held within said thermally conductive metallic retainer.

20. The target assembly of claim 19 wherein said thin metal target base is a wafer or disc cut from a bulk assembly comprising a solid cylindrical rod of magnetically permeable material centrally brazed to a surrounding hollow cylinder of thermally conductive material.

21. The target assembly of claim 19 wherein said thin metal target base is comprised of a physical vapor deposited, machinable, thermally conductive metal on the rear of said sputter target with said magnetically permeable body contained in said thermally conductive metallic retainer.

22. The target assembly of claim 21 wherein said magnetically permeable body is retained in said physical vapor deposited metal by a fastening means selected from the group consisting of a laser weld, spot weld, peen, crimp, and laser or spot welded cover plate over said magnetically permeable body.

23. The target assembly of claim 22 wherein said cover plate has a vacuum relief hole.

24. The target assembly of claim 21 wherein said physical vapor deposited metal is aluminum.

25. The target assembly of claim 19 wherein said bond between the sputter target and the thin metal target base and said bond between the magnetically permeable body and the thermally conductive metallic retainer are selected from the group consisting of brazed, welded, or soldered joints.

26. The target assembly of claim 19 wherein said thermally conductive metallic retainer is selected from the group consisting of copper, aluminum, and molybdenum.

27. The target assembly of claim 18 wherein said magnetically permeable body is imbedded in said base portion of the sputter target.

28. The target assembly of claim 27 wherein said magnetically permeable body is retained in said sputter target by a fastening means selected from the group consisting of a laser weld, spot weld, peen, crimp, or laser or spot welded cover plate over said magnetically permeable body.

29. The target assembly of claim 28 wherein said cover plate has a vacuum relief hole.

30. The target assembly of claim 18 wherein said magnetically permeable body is selected from the group consisting of steel permendur, vanadium permendur, carbon steel, and iron.

31. The target assembly of claim 18 further comprising geometrically-compatible steps in said target assembly that mate with similar geometrically-compatible steps in a sputtering cathode assembly to assist in properly locating the target assembly on the sputtering cathode assembly.

32. The target assembly of claim 18 further comprising a geometry conforming to a sputtering cathode assembly such that it shields a backing plate and other components of the sputtering cathode assembly from contaminating a substrate being coated.

33. A sputtering apparatus comprising:
    a sputtering cathode assembly defining a sputtering area and including permanent magnets and pole pieces;
    a target assembly comprising a sputter target and magnetic attachment means formed integrally with said sputter target;
    wherein said target assembly is magnetically attached to said sputtering cathode assembly by said magnetic attachment means; and
    wherein the sputter target has an exposed sputtering surface which has substantially the same total sputtering area as the cathode assembly.

34. The sputtering apparatus of claim 33 wherein said target assembly has a configuration comprising geometrically-compatible steps in the target assembly that mate with similar geometrically-compatible steps in said cathode assembly to assist in properly locating the target assembly on the cathode assembly.

35. The sputtering apparatus of claim 33 wherein said target assembly has a geometry conforming to said sputtering cathode assembly such that it shields a backing plate and other components of the sputtering cathode assembly from contaminating a substrate being coated.

* * * * *